United States Patent
Lin et al.

(10) Patent No.: US 8,982,530 B2
(45) Date of Patent: Mar. 17, 2015

(54) METHODS AND APPARATUS TOWARD PREVENTING ESC BONDING ADHESIVE EROSION

(71) Applicant: Applied Materials, Inc., Santa Clara, CA (US)

(72) Inventors: Xing Lin, West Babylon, NY (US); Jennifer Y. Sun, Mountain View, CA (US); Sumanth Banda, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 159 days.

(21) Appl. No.: 13/651,967

(22) Filed: Oct. 15, 2012

(65) Prior Publication Data
US 2013/0286530 A1      Oct. 31, 2013

Related U.S. Application Data

(60) Provisional application No. 61/638,908, filed on Apr. 26, 2012.

(51) Int. Cl.
    *H01L 21/683*    (2006.01)
(52) U.S. Cl.
    USPC .......................................................... 361/234

(58) Field of Classification Search
    CPC ................................................... H01L 21/6833
    USPC .......................................................... 361/234
    See application file for complete search history.

(56) References Cited

U.S. PATENT DOCUMENTS

| | | | |
|---|---|---|---|
| 7,033,444 B1 | 4/2006 | Komino et al. | |
| 7,651,571 B2 * | 1/2010 | Migita | 118/728 |
| 8,652,260 B2 * | 2/2014 | Yu et al. | 118/729 |
| 2006/0002053 A1 | 1/2006 | Brown et al. | |
| 2007/0144442 A1 | 6/2007 | Migita | |

OTHER PUBLICATIONS

International Search Report dated Dec. 26, 2012 for PCT/US2012/056617.

* cited by examiner

*Primary Examiner* — Rexford Barnie
*Assistant Examiner* — Tien Mai
(74) *Attorney, Agent, or Firm* — Patterson & Sheridan, LLP (57) ABSTRACT

Embodiments of the present invention provide chamber components having a protective element for shielding bonding material from processing environments in a processing environment. The protective element may include protective seals, protective structures, erosion resistive fillers, or combinations thereof. Embodiments of the present invention reduce erosion of bonding material used in a processing chamber, thus, improving processing quality and reducing maintenance costs.

11 Claims, 6 Drawing Sheets

METHODS AND APPARATUS TOWARD PREVENTING ESC BONDING ADHESIVE EROSION

CROSS-REFERENCE TO RELATED APPLICATIONS

This application claims benefit of U.S. Provisional Patent Application Ser. No. 61/638,908, filed Apr. 26, 2012, which is herein incorporated by reference

BACKGROUND

1. Field of the Invention

Embodiments of the present invention relate to composite structures joined by bonding materials with enhancing thermal and/or chemical stabilities. Particularly, embodiments of the present invention relate to an electrostatic chuck having two or more components joined by a bonding material.

2. Description of the Related Art

Semiconductor processing chambers often include parts that are formed by bonding two or more components together with bonding materials to achieve desired properties. For example, electrostatic chucks, used for supporting and securing substrates during processing, usually include a dielectric puck bonded to a metallic base by a thermal conductive bonding material. The bonding materials provide secured connection between different components while providing thermal conductivity and/or electrical insulation. However, the bonding materials can have negative impact on processing, especially when the processes are performed at elevated temperatures or in a hash chemical environment. For example, when exposed to a plasma, a bonding material in an electrostatic chuck may erode and generate particles causing particle contamination in the processing chamber.

Embodiments of the present invention provide apparatus and methods for preventing bonding material erosion and particle generation.

SUMMARY

Embodiments of the present invention provide apparatus and methods for protecting bonding material used in joining chamber components, such as an electrostatic chuck, from processing environments in a processing environment.

One embodiment of the present invention provides an apparatus for using in a processing chamber. The apparatus includes a first component, a second component and a bonding material joining the first component and the second component. The apparatus further includes a protective element for preventing the bonding material from erosion in the processing chamber.

Another embodiment of the present invention provides an electrostatic chuck for a processing chamber. The electrostatic chuck comprises a chuck body having an upper surface configured to support a substrate thereon and a lower surface opposing the upper surface, a chuck base having an upper surface facing the lower surface of the chuck body, and a bonding material joining the lower surface of the chuck body and the upper surface of the chuck base. The electrostatic chuck further includes a protective element for preventing the bonding material from erosion caused by environment in the processing chamber.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

To facilitate understanding, identical reference numerals have been used, where possible, to designate identical elements that are common to the figures. It is also contemplated that elements and features of one embodiment may be beneficially incorporated on other embodiments without further recitation.

DETAILED DESCRIPTION

Embodiments of the present invention provide apparatus and methods for protecting bonding material used in joining chamber components, such as an electrostatic chuck, from processing environments in a processing environment. In one embodiment, a protective seal is disposed to surround an edge of the bonding material from exposure to processing environment. In another embodiment, a protective structure is formed around a bonding material in a chamber component to prevent direct exposure of the bonding material to the processing environment. According to another embodiment of the present invention, a bonding material comprising a silicon filler and a polymer adhesive base is used in joining chamber components with reduced particle generation. Embodiments of the present invention reduce erosion of bonding material used in a processing chamber, thus, improving processing quality and reducing maintenance costs.

Figure 1A:
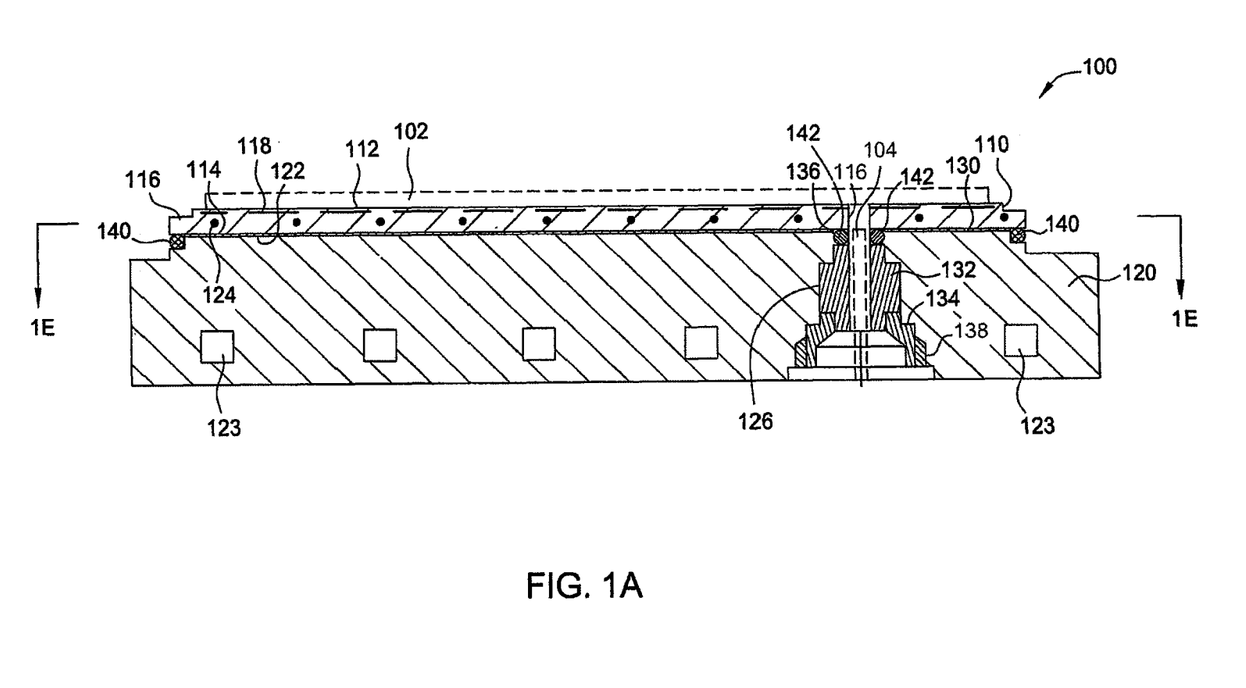
FIG. 1A is a sectional side view of an electrostatic chuck having protective seals according to one embodiment of the present invention.

FIG. 1A is a sectional side view of an electrostatic chuck 100 according to one embodiment of the present invention. The electrostatic chuck 100 may be movably or fixedly positioned in a substrate processing chamber for supporting a substrate during processing. The electrostatic chuck 100 includes a chuck body 110 secured to a chuck base 120 by a bonding material 130. A protective seal 140 is disposed around the bonding material 130 to protect the bonding material 130 from a processing environment.

The chuck body 110 has a substantially planar upper surface 112 for supporting a substrate 102 thereon. The chuck body 110 also has a substantially planar lower surface 114 for receiving the bonding material 130 and coupling to the chuck base 120. The chuck body 110 may be formed from a dielectric material. In one embodiment, the chuck body 110 may be formed from a ceramic, such as aluminum oxide. An electrode 118 may be embedded in the chuck body 110. The electrode 118 may be a thin metal plate or a metal mesh. The electrode 118 may be large enough to encompass substantially the entire area of the substrate 102. The electrode 118 may be coupled to a power source, such as a DC voltage source, to produce electrostatic chucking force to attract and secure the substrate 120 on the upper surface 112. Optionally, the electrode 118 may also be coupled to a RF power source for generating capacitively coupled plasma in a processing chamber.

The chuck body 110 may have three or more through holes 116 to allow lift pins 104 passing through. The chuck body 110 may be shaped according to the shape of the substrate 102 being processed. For example, the chuck body 110 may be a circular disk for supporting a circular substrate, such as a semiconductor substrate. The chuck body 110 may also be a rectangular plate for supporting rectangular substrates, such as glass substrates for forming liquid crystalline display devices.

The chuck base 120 has an upper surface 122 for receiving the bonding material 130 and the chuck body 110. The upper surface 122 may be substantially planar. The chuck base 120 may be formed from a thermal conductive material, such as a metal, to provide temperature control to the chuck body 110. In one embodiment, the chuck base 120 is formed from aluminum. The chuck base 120 may have cooling channels 123 formed therein. The cooling channels 123 may be connected to a cooling fluid source (not shown) and have cooling fluid circulated therein. The chuck base 120 may also have one or more heating elements 124 formed therein for providing heating to the chuck body 110. The one or more heating elements 124 may form multiple heating zones to obtain desired heating effect. According to embodiments of the present application, the one or more heating elements 124 may form four independently controlled heating zones. The chuck base 120 may have lift pin openings 126 formed therethrough and aligned with the through holes 116 in the chuck body 110 for receiving lift pins 104. In one embodiment, casing elements 132, 134, 138 may be disposed in the lift pin openings 126 for guiding the lift pins 104. The casing elements 132, 134, 138 may be formed from a dielectric material, such as VESPEL® polymer or polyether ether ketone (PEEK), to provide electrical isolation between the lift pins 104 and the chuck base 120.

The bonding material 130 is disposed between the lower surface 114 of the chuck body 110 and the upper surface 122 of the chuck base 120 to join the chuck body 110 and the chuck base 120 together. The bonding material 130 may be in the form of a sheet shaped similar to the chuck body 110 and the chuck base 120. In one embodiment, the sheet of bonding material 130 may include three or more lift pin holes 136 corresponding to the through holes 116 for the lift pins 104. Alternatively, the bonding material 130 may be liquid based.

The bonding material 130 is configured to provide secure joint between dissimilar materials, such as the ceramic chuck body 110 and the metallic chuck base 120. The bonding material 130 also provides thermal conduction between the joined components. In one embodiment, the bonding material 130 may be a polymer based bonding adhesive with filler materials to provide thermal conductivity. The bonding material 130 may be a polymer based bonding adhesive with erosion resistive fillers. In one embodiment, the filler material includes silicon and the polymer base material includes Silicone. The concentration of filler material in silicone base is controlled to achieve a thermal conductivity of 1 W/mK.

Fillers in conventional bonding material may be eroded in an etching chemistry, such as a processing environment including $NF_3$ or $NF_3$ and $O_2$, generating white particles and causing contamination. Compared to bonding materials with traditional fillers, the bonding material 130 with silicone base and silicon filler does not causing particle contamination in a processing chemistry including $NF_3$ or $NF_3$ and $O_2$, thus greatly reducing particle contamination. For example, in $NF_3$ chemistry, the base polymer Silicone is attacked and the Silicone volatilizes, leaving the traditional fillers, such as alumina ($Al_2O_3$) fillers, behind causing particle problems. When silicon fillers are used, both the silicon filler and the silicone base volatilize under the NF3 attack without generating any particles. The bonding material 130 comprising silicon fillers may be used alone or in combination with the protective seal 140.

In one embodiment, the protective seal 140 circumscribes the bonding material 130 to prevent interaction between the bonding material 130 and the processing environment. In one embodiment, a recess 144 may be formed between the chuck body 110 and the chuck base 120 to hold the protective seal 140 in position. Optionally, a protective seal 142 may be disposed around each lift pin holes 136 in the bonding material 130 to prevent the bonding material 130 from being exposed to environment in the lift pin holes 136.

The protective seals 140, 142 may be formed from materials maintain a seal between the chuck body 110 and the chuck base 120 when exposed to the processing environment. The protective seals 140, 142 may be formed from an elastomer, such as a perfluoroelastomer. For operating in an etching chemistry including $NF_3$ or $NF_3$ and $O_2$, the protective seals 140, 142 may be formed by one of but not limited to KALREZ® 8575 perfluoroelastomer, DUPRA® 192 perfluoroelastomer, KALREZ® 8085 perfluoroelastomer, CHEMRAZ® XPE elastomer. Other materials, such as L7505, SC513 (Chemraz 513), L8015r1, G758 (Perlast), L8010, are also suitable for protective seals. The protective seals 140, 142 may be in the form of an O-ring, gasket, cup seal or have another suitable profile. The protective seals 140, 142 may optionally be spring loaded.

Figure 1B:
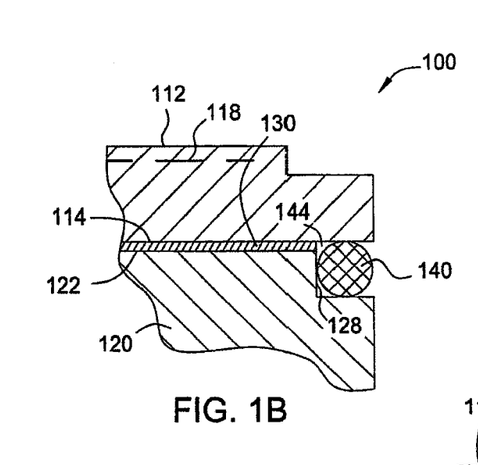
FIG. 1B is an enlarged partial sectional view of the electrostatic chuck of FIG. 1A.

As shown in FIG. 1B, the recess 144 in the electrostatic chuck 100 may be defined by a step formed in the chuck base 120 and the lower surface 114 of the chuck body 110. Since only the chuck base 120 is machined to form the recess 144, this configuration is simple to implement. FIG. 1E is a top view of the chuck base 120 of the electrostatic chuck 100 with the chuck body 110 removed with the protective seals 140, 142 visible.

Alternatively, a recess for the protective seal 140 may be formed in both the chuck body 110 and the chuck base 120, or on the chuck body 110 only.

Figure 1C:
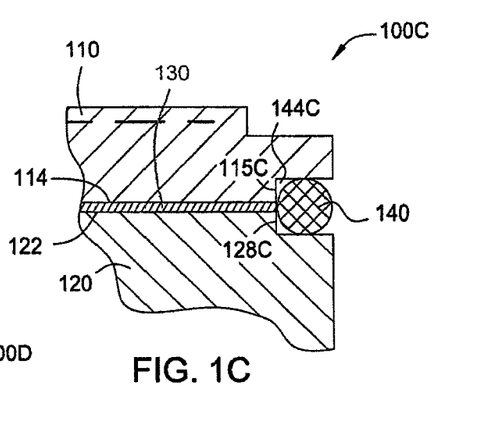
FIG. 1C is an enlarged partial sectional view of an electrostatic chuck according to another embodiment of the present invention.

FIG. 1C is an enlarged partial sectional view of an electrostatic chuck 100C according to another embodiment of the present invention. The electrostatic chuck 100C is similar to the electrostatic chuck 100 of FIG. 1A except that the protective seal 140 is secured in a recess 144C defined by a step 115C formed on the lower surface 114 of the chuck body 110 and a step 128C formed on the upper surface 122 of the chuck base 120. This configuration ensures that the bonding material 130 is covered by a middle portion of the protective seal 140.

Figure 1D:
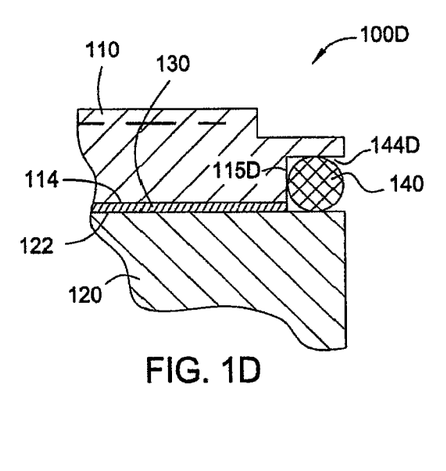
FIG. 1D is an enlarged partial sectional view of an electrostatic chuck according to another embodiment of the present invention.
Figure 1E:
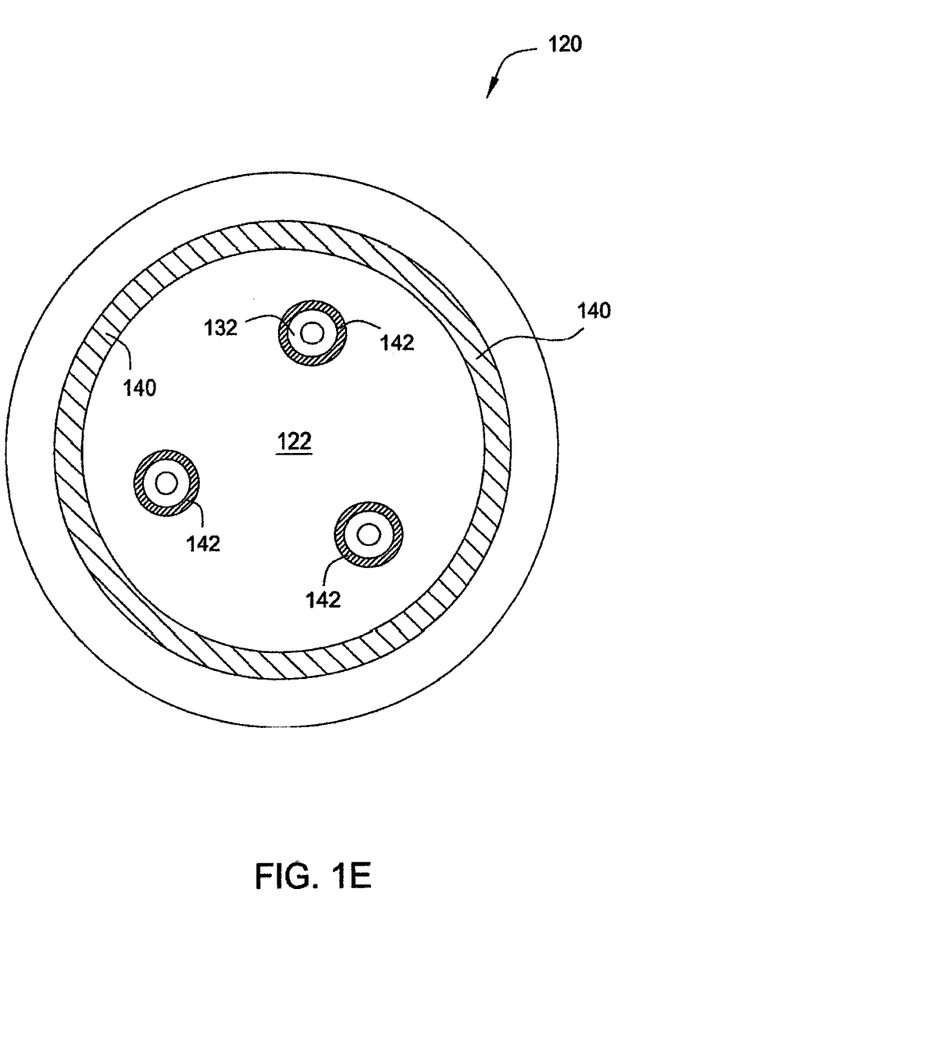
FIG. 1E is a top view of the electrostatic chuck of FIG. 1A with a chuck body removed.

FIG. 1D is an enlarged partial sectional view of an electrostatic chuck 100D according to another embodiment of the present invention. The electrostatic chuck 100D is similar to the electrostatic chuck 100 of FIG. 1A except that the protective seal 140 is secured in a recess 144D defined by a step 115D formed on the lower surface 114 of the chuck body 110 and the upper surface 122 of the chuck base 120. Only the chuck body 110 is machined to form the recess 144d.

In addition or alternative to using a protective seal to prevent erosion to bonding materials, embodiments of the present invention also provide electrostatic chucks having shielding features within the chuck body and/or chuck base for protecting the bonding materials.

Figure 2A:
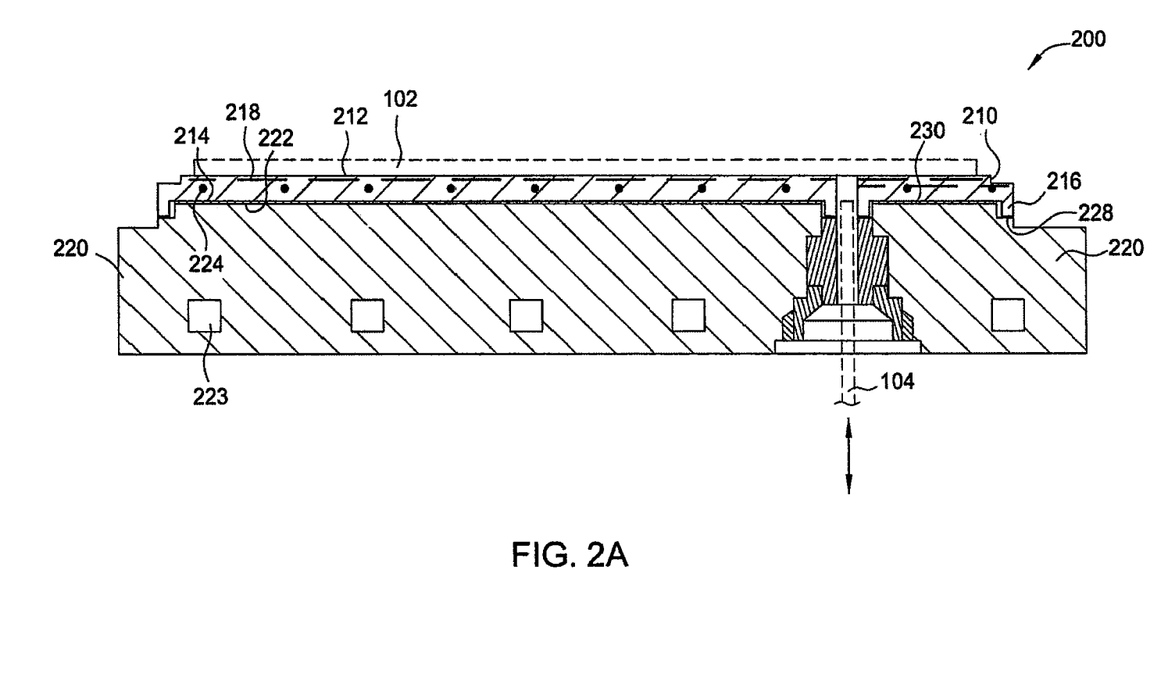
FIG. 2A is a sectional side view of an electrostatic chuck having a protective structure according to one embodiment of the present invention.

FIG. 2A is a sectional side view of an electrostatic chuck 200 having a bonding material protective structure, i.e., a shielding feature, according to one embodiment of the present invention. The electrostatic chuck 200 may be movably or fixedly positioned in a substrate processing chamber for supporting a substrate during processing. Similar to the electrostatic chuck 100, the electrostatic chuck 200 includes a chuck body 210 secured to a chuck base 220 by a bonding material 230 that is the same as the bonding material 130. A protective structure 216 may be formed in the chuck body 210 and/or the chuck base 220 to shield the bonding material 230 from a processing environment.

The chuck body 210 has an upper surface 212 for supporting a substrate 102 thereon and a substantially planar lower surface 214 for receiving the bonding material 230. The chuck body 210 may be formed from a dielectric material. An electrode 218 may be embedded in the chuck body 210.

The chuck base 220 has an upper surface 222 for receiving the bonding material 230 and the chuck body 210. The chuck base 220 may have cooling channels 223 formed therein and heating elements 224 embedded therein for temperature control.

The bonding material 230 is disposed between the lower surface 214 of the chuck body 210 and the upper surface 222 of the chuck base 220 to join the chuck body 210 and the chuck base 220 together. The lower surface 214 of the chuck body 210 and the upper surface 222 of the chuck base 220 may be smaller than outer edges of the chuck body 210 and the chuck base 220 so that the bonding material 230 may be surrounded by the protective structure 216 formed by the chuck body 210 and/or the chuck base 220.

According to the embodiment shown in FIG. 2A, the chuck base 220 has a step 228 dropping down from the upper surface 222. The protective structure 216 is in the form of a lip that extends downward from the lower surface 214 of the chuck body 210. The lip may be continuous. When the chuck body 210 is secured to the chuck base 220, the protective structure 216 in the form of a lip 216 extends above the step 228 and covers the interface between the lower surface 214 of the chuck body 210 and the upper surface of the chuck base 220, thus laterally surrounding the bonding material 230 and shielding the bonding material 230 from line of sight exposure to the environment within the chamber. Without using a protective seal, the protective structure 216 of the electrostatic chuck 200 eliminates the needs to maintain and replace the protective seals, thus, reducing operation cost. In one embodiment, a continuous lip 217 may also be formed around each lift pin passages 219 to prevent the bonding material 230 from being exposed to the processing environment.

Figure 2B:
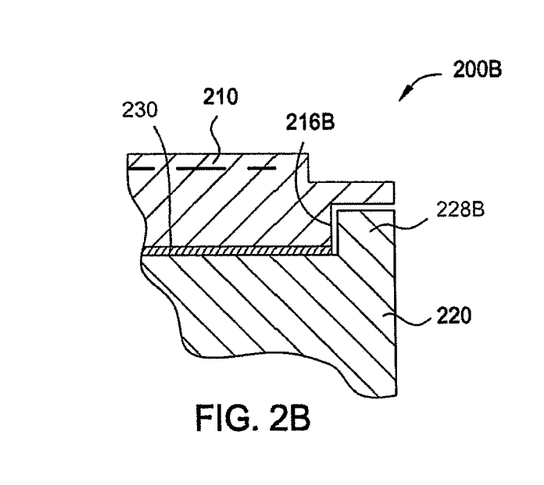
FIG. 2B is an enlarged partial sectional view of an electrostatic chuck having a protective structure according to another embodiment of the present invention.
Figure 2C:
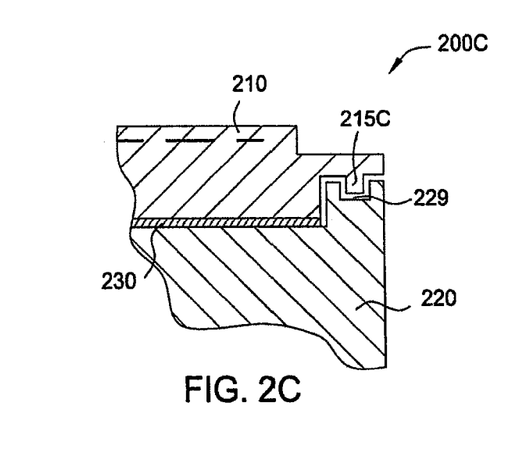
FIG. 2C is an enlarged partial sectional view of an electrostatic chuck having a protective structure according to another embodiment of the present invention.

Even though the protective structure 216 is shown in FIG. 2A to be in a form of a lip from the chuck body 210, any suitable structures may be used to shield the bonding material 230. For example, FIG. 2B is an enlarged partial sectional view of an electrostatic chuck 200B having a protective structure in the form of a protective lip 228B extending upwardly from chuck base 220 and surrounding an outer edge 216B of the chuck body 210. In an electrostatic chuck 200C shown in FIG. 2C, the chuck base 220 has a groove 229 configured to receive a lip 215C from the chuck body 210. The groove 229 and the lip 215C form a maze to isolate the bonding material 230 from the processing environment surrounding the electrostatic chuck 200C.

According to embodiments of the present invention, one or more protective elements, such as protective seals, protective structures, or erosion resistive fillers may be used alone or in combination to prevent bonding material from erosion in a processing environment.

Electrostatic chucks according to embodiments of the present invention may be used in various processing chambers, such as in plasma etching chambers, chemical vapor deposition chambers, plasma enhanced deposition chambers, atomic layer deposition chambers, ion implantation chamber, for supporting substrates during processing.

Figure 3:
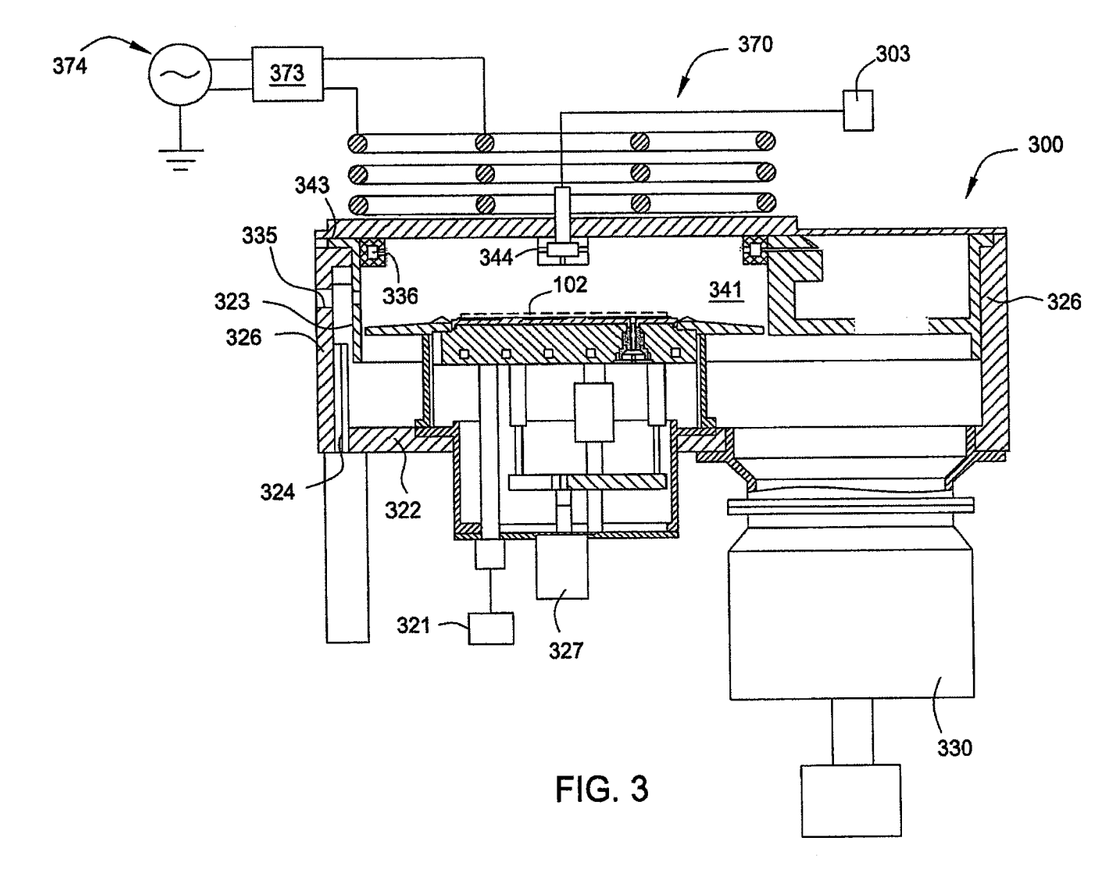
FIG. 3 is a sectional side view of a plasma processing chamber having an electrostatic chuck according to embodiments of the present invention.

FIG. 3 is a sectional side view of a plasma processing chamber 300 having the electrostatic chuck 100 disposed therein. The electrostatic chuck 100 may be used to support a variety of substrates, such as semiconductor substrates and reticles, and accommodating a variety of substrate sizes. Alternatively, any electrostatic chuck described above may be used in position of the electrostatic chuck 100.

The plasma processing chamber 300 includes a bottom 322, sidewalls 326 and a chamber lid 343 disposed over the sidewalls 326 defining a processing volume 341. The plasma processing chamber 300 further includes a liner 323 disposed in the processing volume 341 to prevent the sidewalls 326 from damage and contamination from the processing chemistry and/or processing by-products. A slit valve door opening 335 is formed through the sidewall 326 and the liner 323 to allow passage of the substrates and substrate transfer mechanism. A slit valve door 324 selectively open and close the slit valve door opening 335.

The electrostatic chuck 100 is disposed in the processing volume 341. A lift 327 is configured to raise and lower lift pins (not shown) relative to the electrostatic chuck 100 during processing and loading/unloading the substrate 102. The electrostatic chuck 100 may be coupled to a bias power source 321 for generating chucking force to secure the substrate 102 on the electrostatic chuck 100.

One or more processing gases may be supplied to the processing volume 341 from a gas source 303 via an inlet 344. A vacuum pump 330 is fluid communication with the processing volume 341. The vacuum pump 330 may be used to pump the processing volume 341 and maintain a low pressure environment through a plenum 336.

The plasma processing chamber 300 includes an antenna assembly 370 disposed outside the chamber lid 343. The antenna assembly 370 may be coupled to a radio-frequency (RF) plasma power source 374 through a matching network 373. During processing, the antenna assembly 370 is energized with RF power provided by the power source 374 to ignite a plasma of processing gases within the processing volume 341 and to maintain the plasma during processing of the substrate 102.

The plasma processing chamber 300 may be used for various plasma processes. In one embodiment, the plasma processing chamber 300 may be used to perform drying etching with one or more etching agents. For example, the plasma processing chamber 300 may be used for ignition of plasma from a precursor including $C_xF_y$ (where x and y can be different allowed combinations), $O_2$, $NF_3$, or combinations thereof. Embodiments of the present invention may also be used in etching chromium for photomask applications, etching a profile, such as a deep trench and through silicon vias (TSV), in a silicon substrate having oxide and metal layers disposed on the substrate.

Even though electrostatic chucks joined by bonding materials are described above, embodiments of the present invention may be used in any composite structures joined by bonding materials to protect the bonding material from operating environment. For example, embodiments of the present invention may be applied to gas distribution showerheads having two or more components joined by a bonding material.

While the foregoing is directed to embodiments of the present invention, other and further embodiments of the invention may be devised without departing from the basic scope thereof, and the scope thereof is determined by the claims that follow.

The invention claimed is:

1. An electrostatic chuck for a processing chamber, comprising:
 a chuck body having an upper surface configured to support a substrate thereon and a lower surface opposite the upper surface;
 a chuck base having an upper surface facing the lower surface of the chuck body;
 a bonding material joining the lower surface of the chuck body and the upper surface of the chuck base;
 a passageway through the chuck body, the chuck base and the bonding material, wherein the passageway is formed by internal surfaces of the chuck body, the chuck base and the bonding material; and
 a protective element which is positioned in the passageway to prevent line of sight exposure of the bonding material to an environment exterior to the electrostatic chuck.

2. The electrostatic chuck of claim 1, wherein the protective element comprises a protective seal disposed between the lower surface of the chuck body and the upper surface of the chuck base, the protective seal surrounding the bonding material.

3. The electrostatic chuck of claim 2, wherein the protective element further comprises a protective seal disposed within the passageway, and the protective seal is configured for a lift pin to travel therethrough.

4. The electrostatic chuck of claim 2, wherein the protective seal is disposed in a recess formed between the chuck base and the chuck body.

5. The electrostatic chuck of claim 4, wherein the recess is defined by the lower surface of the chuck body and a step formed at the upper surface of the chuck base.

6. The electrostatic chuck of claim 4, wherein the recess is defined by the upper surface of the chuck base and a step formed at the lower surface of the chuck body.

7. The electrostatic chuck of claim 4, wherein the recess is defined by a first step formed on the lower surface of the chuck body and a second step formed on the upper surface of the chuck base.

8. The electrostatic chuck of claim 1, wherein the protective element comprises a protective structure formed in at least one of the chuck body and the chuck base, the protective element covering the bonding material.

9. The electrostatic chuck of claim 8, wherein the protective structure comprises a continuous lip extending from the lower surface of the chuck body towards the chuck base and surrounding an edge region of the bonding material.

10. The electrostatic chuck of claim 9, wherein the protective structure further comprises a groove formed in the chuck base and configured to receive the continuous lip therein.

11. The electrostatic chuck of claim 1, wherein the protective element comprises an erosion resistive filler disposed in the bonding material.

* * * * *